(12) United States Patent
Kim

(10) Patent No.: US 11,726,878 B2
(45) Date of Patent: Aug. 15, 2023

(54) MEMORY SYSTEM AND OPERATING METHOD THEREOF

(71) Applicant: SK hynix Inc., Icheon-si (KR)

(72) Inventor: Kwang Su Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 330 days.

(21) Appl. No.: 17/191,190

(22) Filed: Mar. 3, 2021

(65) Prior Publication Data

US 2022/0114054 A1 Apr. 14, 2022

(30) Foreign Application Priority Data

Oct. 14, 2020 (KR) .......................... 10-2020-0132311

(51) Int. Cl.
*G06F 11/14* (2006.01)
*G06F 3/06* (2006.01)

(52) U.S. Cl.
CPC ........ *G06F 11/1415* (2013.01); *G06F 3/0602* (2013.01); *G06F 3/064* (2013.01); *G06F 3/0659* (2013.01); *G06F 3/0673* (2013.01)

(58) Field of Classification Search
CPC .. G06F 11/1415; G06F 3/0673; G06F 3/0659; G06F 3/064; G06F 3/0602
See application file for complete search history.

(56) References Cited

U.S. PATENT DOCUMENTS

2019/0146688 A1* 5/2019 Oh .......................... G06F 3/064
  711/103
2020/0042200 A1* 2/2020 Kanno .................. G06F 3/0619

FOREIGN PATENT DOCUMENTS

KR  10-2019-0088184 B1  7/2019
KR  10-2019-0102998 A1  9/2019

* cited by examiner

*Primary Examiner* — Jigar P Patel
(74) *Attorney, Agent, or Firm* — Weaver Austin Villeneuve & Sampson LLP

(57) ABSTRACT

Embodiments of the present disclosure relate to a memory system and an operating method thereof. The memory system may include a first processor and a second processor. The first processor is configured to manage or process a main read count table including a plurality of first read count table entries each corresponding to one of a plurality of super memory blocks. The second processor is configured to manage or process, when an error occurs during an operation of reading data stored in one of the plurality of super memory blocks, a partial read count table including a read count table entry including information on a count of the read operation executed during a recovery operation for the error, and transmit an update message to the first processor for updating the main read count table based on the partial read count table.

20 Claims, 18 Drawing Sheets

FIG.5

MRCT

| SB | CNT_MAIN | CNT_SUB | | | | | | | |
|---|---|---|---|---|---|---|---|---|---|
| | | P0 | P1 | P2 | P3 | P4 | P5 | P6 | P7 |
| SB[1] | 50 | 2 | 2 | 2 | 2 | 3 | 3 | 3 | 3 |
| SB[2] | 70 | 2 | 2 | 2 | 2 | 3 | 3 | 3 | 3 |
| SB[3] | 80 | 2 | 2 | 2 | 2 | 3 | 3 | 3 | 3 |
| ... | ... | ... | ... | ... | ... | ... | ... | ... | ... |
| SB[N] | 40 | 2 | 2 | 2 | 2 | 3 | 3 | 3 | 3 |

(RCE for each row)

PRCT

| SB | CNT_MAIN | CNT_SUB | | | | | | | |
|---|---|---|---|---|---|---|---|---|---|
| | | P0 | P1 | P2 | P3 | P4 | P5 | P6 | P7 |
| SB[1] | 50 | 2 | 2 | 2 | 2 | 3 | 3 | 3 | 3 |
| SB[3] | 80 | 2 | 2 | 2 | 2 | 3 | 3 | 3 | 3 |
| SB[N] | 40 | 2 | 2 | 2 | 2 | 3 | 3 | 3 | 3 |

(RCE for each row)

FIG. 7
PRCT
| SB | CNT_MAIN | CNT_SUB | | | | | | | |
|---|---|---|---|---|---|---|---|---|---|
| | | P0 | P1 | P2 | P3 | P4 | P5 | P6 | P7 |
| SB[1] | 50 | 2 | 2 | 2 | 2 | 3 | 3 | 3 | 3 |
| SB[3] | 80 | 2 | 2 | 2 | 2 | 3 | 3 | 3 | 3 |
| SB[N] | 40 | 2 | 2 | 2 | 2 | 3 | 3 | 3 | 3 |
During recovery for error occurred in reading operation on SB3, two read operations for P4 occur
| SB | CNT_MAIN | CNT_SUB | | | | | | | |
|---|---|---|---|---|---|---|---|---|---|
| | | P0 | P1 | P2 | P3 | P4 | P5 | P6 | P7 |
| SB[1] | 50 | 2 | 2 | 2 | 2 | 3 | 3 | 3 | 3 |
| SB[3] | 80 | 2 | 2 | 2 | 2 | 5 | 3 | 3 | 3 |
| SB[N] | 40 | 2 | 2 | 2 | 2 | 3 | 3 | 3 | 3 |
(Threshold sub-read count = 5)
Increase main read count by 1st value(=1) / Decrease sub-read count by 2nd value(=1)
| SB | CNT_MAIN | CNT_SUB | | | | | | | |
|---|---|---|---|---|---|---|---|---|---|
| | | P0 | P1 | P2 | P3 | P4 | P5 | P6 | P7 |
| SB[1] | 50 | 2 | 2 | 2 | 2 | 3 | 3 | 3 | 3 |
| SB[3] | 81 | 1 | 1 | 1 | 1 | 4 | 2 | 2 | 2 |
| SB[N] | 40 | 2 | 2 | 2 | 2 | 3 | 3 | 3 | 3 |

MEMORY SYSTEM AND OPERATING METHOD THEREOF

CROSS-REFERENCE TO RELATED APPLICATION

The present application claims priority under 35 U.S.C. 119(a) to Korean patent application number 10-2020-0132311 filed on Oct. 14, 2020, which is incorporated herein by reference in its entirety.

BACKGROUND

1. Technical Field

The embodiments relate to a memory system and an operating method thereof.

2. Related Art

A memory system can include a storage device or memory device to store data. Such a memory system can operate on the basis of a request from a host, such as computers, mobile devices (e.g., smartphone or tablet PC), or other similar electronic devices. Examples of the memory system span from a traditional hard disk drive (HDD) to a semiconductor-based data storage device such as a solid state drive (SSD), a universal flash storage device (UFS), or an embedded MMC (eMMC) device.

The memory system may further include a memory controller for controlling the memory device. The memory controller may receive a command from the host and execute the command or control read/write/erase operations on the memory devices included in the memory system. The memory controller may also be used to run firmware for performing a logical operation for controlling such operations.

The memory system may execute a read reclaim operation for a memory block on which the read operation has been repeatedly executed in order to solve the read disturbance caused by the operation of reading data from the memory device. In this case, in order to normally execute a read reclaim operation, the memory system may be required to accurately calculate a read count which is a count at which the read operation is performed in each memory block.

SUMMARY

Embodiments of the disclosure may provide a memory system and an operating method thereof capable of, when determining whether to execute a read reclaim operation, reflecting a count of a read operation generated during a recovery operation for an error which occurs during the read operation.

In addition, embodiments of the disclosure may provide a memory system and an operating method thereof capable of minimizing performance degradation which occurs in the process of updating the read count table.

In one aspect, embodiments of the disclosure may provide a memory system including a memory device, which includes a plurality of super memory blocks, and a memory controller for communicating with the memory device and controlling the memory device.

The memory controller may include a first processor and a second processor.

The first processor may manage a main read count table including a plurality of first read count table entries, each one of the plurality of first read count table entries corresponding to one of the plurality of super memory blocks, a first read count table entry includes information on a count of a first read operation executed on a corresponding super memory block.

The second processor may manage a partial read count table including a plurality of second read count table entries, a second read count table entry including information on a count of a second read operation executed during a recovery operation for an error, when the error occurs during an operation of reading data stored in one of the plurality of super memory blocks, and may transmit an update message to the first processor when updating the main read count table based on the partial read count table.

In another aspect, embodiments of the disclosure may provide an operating method of a memory system including a plurality of super memory blocks, a first processor, and a second processor.

The operating method of the memory system may include updating, when an error occurs while reading data stored in one of the plurality of the super memory blocks, by the second processor, a partial read count table storing a plurality of second read count table entries, each second read count table entry including information on a count of a read operation executed during a recovery operation for the error.

The operating method of the memory system may include determining, by the second processor, whether to update a main read count table based on the updated partial read count table, the main read count table including a plurality of first read count table entries, each one of the plurality of first read count table entries corresponding to one of the plurality of the super memory blocks based on the partial read count table, a first read count table entry includes information on a count of the read operation executed on a corresponding super memory block.

The operating method of the memory system may include transmitting, when the main read count table is determined to be updated, by the second processor, an update message to the first processor.

According to embodiments of the disclosure, it is possible to, when determining whether to execute a read reclaim operation, reflect a count of a read operation generated during a recovery operation for an error which occurs during the read operation.

In addition, according to the embodiments of the disclosure, it is possible to minimize performance degradation which occurs in the process of updating a read count table.

BRIEF DESCRIPTION OF THE DRAWINGS

FIG. 5 is a diagram illustrating an exemplary structure of a main read count table and a partial read count table according to embodiments of the present disclosure.

FIG. 7 is a diagram illustrating an example in which a second processor updates a partial read count table according to embodiments of the present disclosure.

DETAILED DESCRIPTION

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
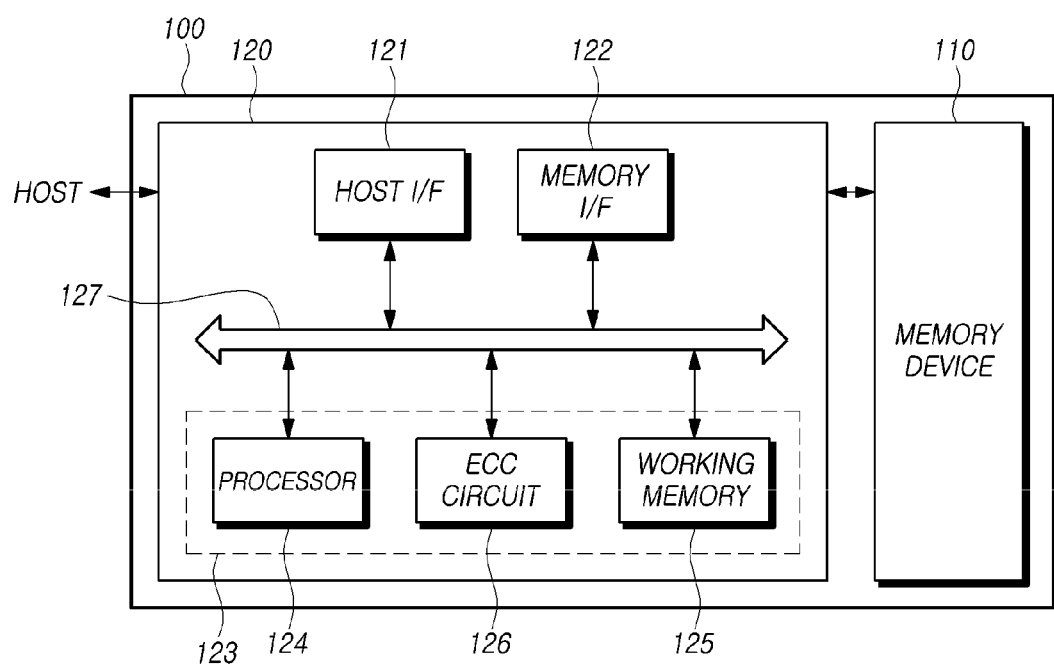
FIG. 1 is a diagram illustrating a schematic configuration of a memory system based on an embodiment of the disclosed technology.

FIG. 1 is a diagram illustrating the schematic configuration of a memory system 100 based on an embodiment of the disclosed technology.

In some implementations, the memory system 100 may include a memory device 110 configured to store data, and a memory controller 120 configured to control the memory device 110.

The memory device 110 may include multiple memory blocks each including a predetermined number of memory cells for storing data. The memory device 110 may be configured to operate in response to control signals received from the memory controller 120. Operations of the memory device 110 may include, for example, a read operation, a program operation (also referred to as a "write operation"), and an erasure operation.

The memory cells in the memory device 110 are used to store data and may be arranged in a memory cell array. In some implementations where the memory device 110 is a flash memory device, the memory cell array may be divided into memory blocks of memory cells and each block includes different pages of memory cells. In some implementations of NAND flash memory devices, a page of cells is the smallest memory unit that can be programmed (or written) and read, and the data stored in memory cells can be erased at the block level.

In some implementations, the memory device 110 may be implemented as various types, such as a double data rate synchronous dynamic random access memory (DDR SDRAM), a low power double data rate fourth generation (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Some embodiments of the disclosed technology are applicable to any type of flash memory devices having an electric charge storage layer. In an implementation, the electric charge storage layer may be formed of a conductive material, and such an electric charge storage layer can be referred to as a floating gate. In another implementation, the electric charge storage layer may be formed of an insulating material, and such a flash memory device can be referred to as a charge trap flash (CTF).

The memory device 110 may be configured to receive a command and an address from the memory controller 120 to access an area of the memory cell array selected using the address. That is, the memory device 110 may perform an operation corresponding to the received command on a memory area in the memory device having a physical address corresponding to the received address from the controller.

In some implementations, the memory device 110 may perform, among others, a program operation, a read operation, and an erasure operation. During the program operation, the memory device 110 may write ("program") data to an area selected by the address. During the read operation, the memory device 110 may read data from a memory area selected by the address. During the erasure operation, the memory device 110 may erase data stored in a memory area selected by the address.

The memory controller 120 may control write (program), read, erasure, and background operations to be performed on the memory device 110. The background operation may include operations that are implemented to optimize the overall performance of the memory device 110, such as a garbage collection (GC) operation, a wear leveling (WL) operation, and a bad block management (BBM) operation.

The memory controller 120 may control the operation of the memory device 110 at the request of a host. Alternatively, the memory controller 120 may control the operation of the memory device 110 even in the absence of request from the host when it performs such a background operation of the memory device.

The memory controller 120 and the host may be separate devices. In some implementations, the memory controller 120 and the host may be integrated in a single device. In the following description, as an example, the memory controller 120 and the host are separate devices.

Referring to FIG. 1, the memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to run a flash translation layer (FTL) to effectively manage the memory operations on the memory system 100. For example, the processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit. Typical address mapping methods may include a page mapping method, a block mapping method, and a hybrid mapping method.

The processor 124 may be configured to randomize data received from the host to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. In other words, the processor 124 may control the overall operation of the memory controller 120 and, in order to perform a logical operation, may execute (drive) firmware loaded into the working memory 125 during booting.

The firmware refers to a program or software stored in a nonvolatile memory, e.g., a ROM, an EPROM, an EEPROM, a NAND flash memory, a NOR flash memory, and the like, and is executed by the processor 124 inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one of a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In the context of this disclosure, a "sector" may refer to a data unit that is smaller than the smallest unit for read operations (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equal to the reference value, the error detection/correction circuit 126 may determine that the corresponding sector is correctable and the corresponding sector can be marked "pass."

The error detection/correction circuit 126 may perform error detection and correction operations successively on all read data. When a sector included in the read data is correctable, the error detection/correction circuit 126 may go on to the next sector to check whether an error correction operation is needed on the next sector. Upon completion of the error detection and correction operations on all the read data in this manner, the error detection/correction circuit 126 may identify which sector is deemed uncorrectable in the read data. The error detection/correction circuit 126 may provide information (e.g., address of uncorrectable sector) regarding the sectors deemed uncorrectable to the processor 124.

The memory system 100 may also include a bus 127 to provide a communication channel between the constituent elements 121, 122, 124, 125, and 126 of the memory controller 120. The bus 127 may include, for example, a control bus for delivering various types of control signals and commands, and a data bus for delivering various types of data.

The above-mentioned constituent elements 121, 122, 124, 125, and 126 of the memory controller 120 are illustrated in FIG. 1 by way of example. It is noted that some of the above-mentioned constituent elements 121, 122, 124, 125, and 126 of the memory controller 120 may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Hereinafter, the memory device 110 will be described in more detail with reference to FIG. 2.

Figure 2:
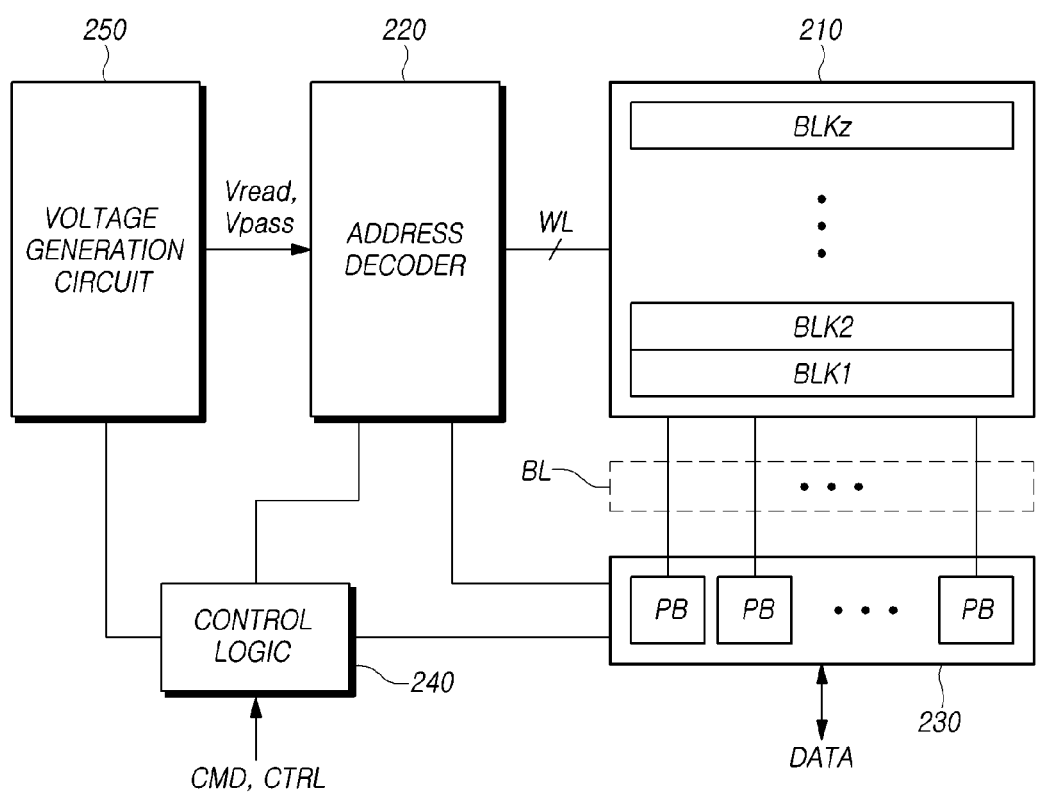
FIG. 2 is a block diagram schematically illustrating a memory device based on an embodiment of the disclosed technology.

FIG. 2 is a block diagram schematically illustrating a memory device 110 based on an embodiment of the disclosed technology.

In some implementations, the memory device 110 based on an embodiment of the disclosed technology may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be arranged in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure and, in some implementations, may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data per memory cell. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data. As another example, the memory cell array 210 may include multiple memory cells that are configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to commands and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may apply the read voltage Vread to a selected word line WL inside a selected memory block, when applying the read voltage during a read operation, and may apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation on a page by page basis. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that can hold data for data processing and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, a change in the amount of current that flows based on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level at sensing nodes of multiple page buffers PB.

The control logic 240 may control the read/write circuit 230 to perform a read operation on the memory cells in the memory cell array 210. The voltage generation circuit 250 may generate a read voltage Vread and a pass voltage Vpass, which are used during the read operation, in response to a voltage generation circuit control signal provided by the control logic 240.

A memory block BLK included in the memory device 110 may consist of multiple pages PG, each of which includes a plurality of memory cells. In some implementations, the plurality of memory cells can be arranged in multiple strings. The multiple pages PG can be mapped to multiple word lines WL, and the multiple strings STR can be mapped to multiple bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

The multiple word lines WL and the multiple bit lines BL may intersect with each other when viewed from above, thereby defining a memory array including multiple memory cells MC. Each memory cell MC may have a transistor TR arranged therein.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some cases, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed on a page by page basis, and an erasure operation may be performed on a memory block by memory block basis.

Figure 3:
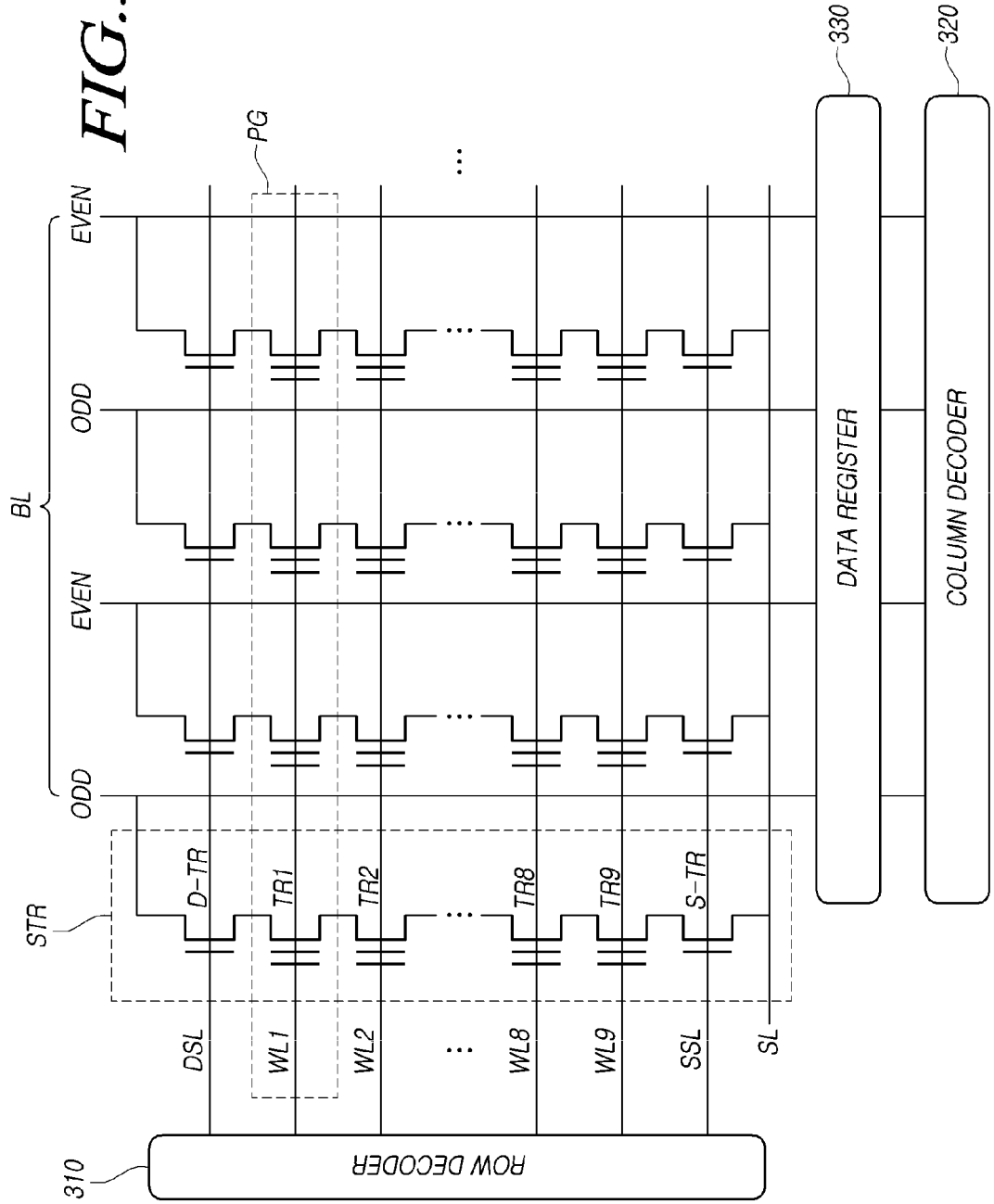
FIG. 3 is a diagram illustrating a structure of word lines and bit lines of a memory device based on an embodiment of the disclosed technology.

FIG. 3 is a diagram illustrating a structure of word lines WL and bit lines BL of a memory device 110 based on an embodiment of the disclosed technology.

Referring to FIG. 3, the memory device 110 has a core area in which memory cells MC are concentrated, and an auxiliary area which corresponds to the remaining area other than the core area. The auxiliary area includes circuitry for supporting the operations of the memory cell array 210.

The core area may include pages PG and strings STR. In some implementations, multiple word lines WL1-WL9 and multiple bit lines BL are arranged to intersect with each other, but electrically isolated from each other when viewed from above.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in connection with conducting a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of odd-numbered bit line BL and even-numbered bit line B are coupled in common to a column decoder 320.

The address may be used to access one or more memory cells MC in the core area. The address can be provided through the input/output end to the row decoder 310 and the column decoder 320 to select a corresponding target memory cell. In the context of this disclosure, the word "target memory cell" can be used to indicate one of the memory cells MC targeted to be accessed from the memory controller or the user, and in some implementations the memory cells MC may be located at intersections between the word lines WL1-WL9 connected to the row decoder 310 and the bit lines BL connected to the column decoder 320.

Pages PG in a first direction (for example, X-axis direction) are connected to a commonly used line referred to as a word line WL, and strings STR in a second direction (for example, Y-axis direction) are connected to a common line referred to as a bit line BL. The voltage applied to a memory cell MC in the middle position or last position among memory cells MC connected in series may slightly differ from the voltage applied to the memory cell MC in the first position and from the voltage applied to the memory cell MC in the last position, due to the voltage drop across the preceding memory cell MC.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

Referring to the example illustrated in FIG. 3, in one string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is farther from the data register 330 and has a longer signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding string STR to the data register 330. The second selection transistor S-TR is used as a switch circuit that connects the corresponding string STR to the source line SL. That is, the first selection transistor D-TR and the second selection transistor S-TR can be used to enable or disable the corresponding string STR.

During a program operation, the memory system 100 fills the target memory cell MC of the bit line BL which is to be programmed with electrons. Accordingly, the memory system 100 applies a predetermined turn-on voltage Vcc to the gate electrode of the first selection transistor D-TR, thereby turning on the first selection transistor D-TR, and applies a predetermined turn-off voltage (for example, 0V) to the gate electrode of the second selection transistor S-TR, thereby turning off the second selection transistor S-TR.

The memory system 100 turns on both the first and second selection transistors D-TR and S-TR during a read operation or a verification operation. Accordingly, during a read operation or a verification operation, an electric current may flow through the corresponding string STR and drain to the source line SL, which corresponds to the ground voltage, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through the source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gate FG of the selected memory cell.

Figure 4:
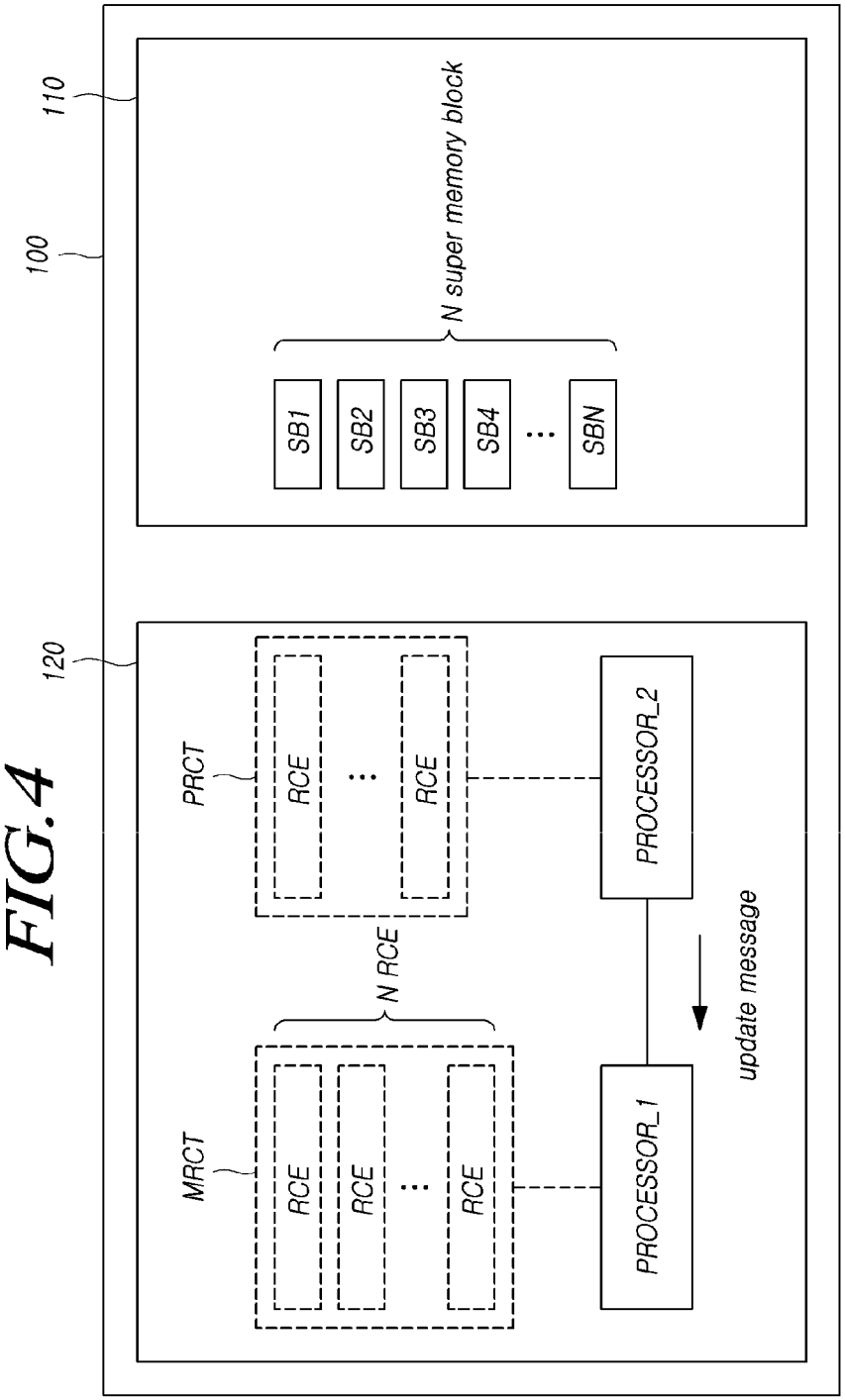
FIG. 4 is a diagram illustrating the structure of a memory system according to embodiments of the present disclosure.

FIG. 4 is a diagram illustrating the structure of a memory system 100 according to embodiments of the present disclosure. The memory system 100 may include a memory device 110 and a memory controller 120 configured to control the memory device 110.

The memory device 110 of the memory system 100 may include a plurality of super memory blocks. In FIG. 4, the memory device 110 may include N (N is a natural number of 2 or more) of super memory blocks SB1, SB2, SB3, SB4, . . . , SBN.

In this case, the super memory block may be a logical unit including one or more memory blocks disposed in the memory device 110. The memory block included in one super memory block may be determined in various ways. For example, when the memory device 110 includes a plurality of memory dies, and each memory die includes a plurality of planes, memory blocks disposed in one super memory block may be placed on another plane of another die.

In addition, the memory controller 120 of the memory system 100 may include a first processor PROCESSOR_1 and a second processor PROCESSOR_2. The first processor PROCESSOR_1 and the second processor PROCESSOR_2 may be sub-processors as a part of the processor 124 described in FIG. 1 or may be separate processors located outside the processor 124. The first processor PROCESSOR_1 and the second processor PROCESSOR_2 each may include one or more cores.

Each of the first processor PROCESSOR_1 and the second processor PROCESSOR_2 may perform different functions. For example, the first processor PROCESSOR_1 may perform the operation of the flash translation layer FTL described above, and the second processor PROCESSOR_2 may perform the operation of the flash interface layer FIL described above.

In FIG. 4, the first processor PROCESSOR_1 may be configured to manage a main read count table (MRCT) including a number N of read count table entries (RCE) corresponding to each of the N super memory blocks SB1, SB2, SB3, SB4, . . . , SBN.

The second processor PROCESSOR_2 may be configured to manage a partial read count table (PRCT) including a number of second read count table entries (RCE), a second read count table entry including information on a count of a read operation executed during the recovery operation (e.g., a read retry operation) for an error, when the error (fail) occurs during the operation of reading data stored in any one of the N super memory blocks SB1, SB2, SB3, SB4, . . . , SBN. Since the first processor PROCESSOR_1 cannot directly know the count of read operations executed during the error recovery operation, the second processor PROCESSOR_2 may manage this through the partial read count table (PRCT), and then may inform the first processor PROCESSOR_1 of the count of the read operations.

In this case, the number of second read count table entries (RCE) included in the partial read count table PRCT may be N or less. That is, in some embodiments, the PRCT can have the same number of second RCEs as the first RCEs. In other embodiments, the PRCT can have the number of second RCEs fewer than the number of the first RCSs in the MRCT.

A read count table entry RCE included in the main read count table MRCT or the partial read count table PRCT may be associated with one of a plurality of super memory blocks SB1, SB2, SB3, SB4, . . . , SBN, and may include information on the count of read operations executed for a super memory block corresponding to a corresponding read count table entry RCE after a specific time point (e.g., reboot time/initialization time).

When updating the main read count table MRCT based on the partial read count table PRCT, the second processor PROCESSOR_2 may transmit the update message to the first processor PROCESSOR_1.

The structure of the main read count table MRCT, the partial read count table PRCT, and the read count table entry RCE will be described in detail.

FIG. 5 is a diagram illustrating an example of the structure of the main read count table MRCT and the partial read count table PRCT according to embodiments of the present disclosure.

Referring to FIG. 5, the main read count table MRCT may include a number N of first read count table entries (RCEs) each corresponding to one of the N super memory blocks SB1, SB2, SB3, SB4, . . . , SBN. In this case, for a super memory block corresponding to a first read count table entry, each first read count table entry RCE included in the main read count table MRCT may include a main read count (CNT_MAIN) corresponding to the entire super memory block and a plurality of sub-read counts (CNT_SUB) each corresponding to one of a plurality of sub-area P0 to P7 included in the corresponding super memory block.

In this case, the sub-area of the super memory block may be determined in various ways. For example, if the memory device 110 includes a plurality of memory dies, and each memory die includes a plurality of planes, memory blocks disposed in different planes among one or more memory blocks included in the super memory block may each constitute different sub-areas.

In FIG. 5, each first read count table entry RCE may include one main read count CNT_MAIN and eight sub-read counts CNT_SUB corresponding to each of the eight sub-areas P0, P1, P2, P3, P4, P5, P6, P7. It will be appreciated that the number of sub-areas described in FIG. 5 is an exemplary embodiment, and the number of sub-areas included in one super memory block is not limited thereto.

In one exemplary embodiment, the main read count CNT_MAIN of the first read count table entry RCE corresponding to the super memory block SB1 in the main read count table MRCT is 50, and the eight sub-read counts CNT_SUB P0, P1, P2, P3, P4, P5, P6, P7, and P8 are 2, 2, 2, 2, 3, 3, 3 and 3, respectively. In addition, in the main read count table MRCT, the main read count CNT_MAIN of the first read count table entry RCE corresponding to the super memory block SB2 is 70, and the eight sub-read counts CNT_SUB P0, P1, P2, P3, P4, P5, P6, P7, and P8 are 2, 2, 2, 2, 3, 3, 3 and 3, respectively. In the main read count table MRCT, the main read count CNT_MAIN of the read count table entry RCE corresponding to the super memory block SB3 is 80, and the eight sub-read counts CNT_SUB are 2, 2, 2, 2, 3, 3, 3 and 3, respectively. In the main read count table MRCT, the main read count CNT_MAIN of the first read count table entry RCE corresponding to the super memory block SBN is 40, and the eight sub-read counts CNT_SUB P0, P1, P2, P3, P4, P5, P6, P7, and P8 are 2, 2, 2, 2, 3, 3, 3 and 3, respectively.

In addition, the partial read count table PRCT may include a number of second read count table entries (RCE) corresponding to some of the N super memory blocks (e.g., a super memory block in which the error occurs during the operation of reading stored data). In FIG. 5, the partial read count table PRCT may include three second read count table entries (RCE) corresponding to three super memory blocks SB1, SB3, and SBN. However, the number of second read count table entries (RCE) included in the partial read count table PRCT may vary depending on whether an error occurs during the read operation.

Figure 6:
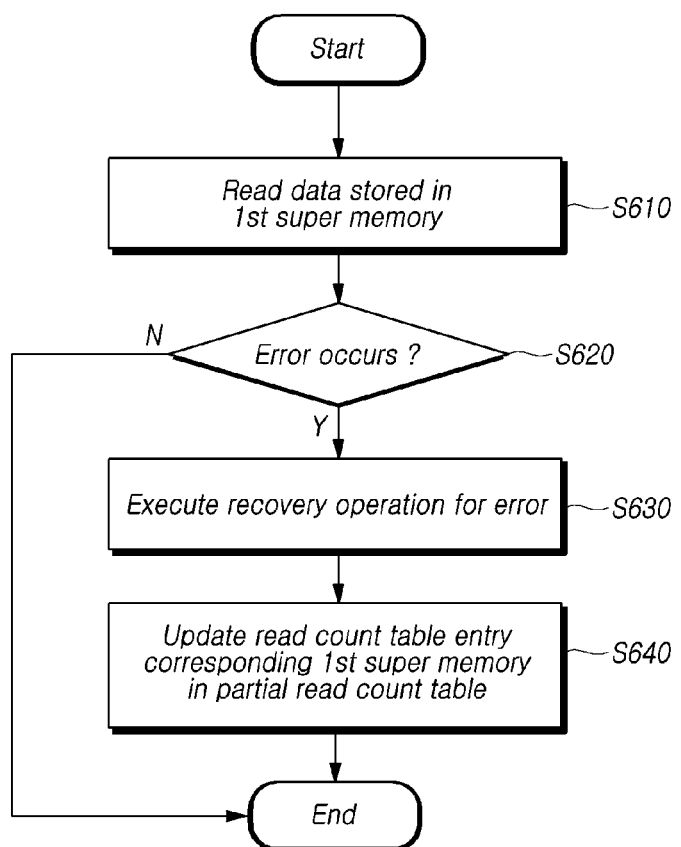
FIG. 6 is a flowchart illustrating an exemplary operation of a second processor according to embodiments of the present disclosure.

FIG. 6 is a flowchart illustrating an exemplary operation of a second processor PROCESSOR_2 according to embodiments of the present disclosure.

Referring to FIG. 6, the second processor PROCESSOR_2 of the memory system 100 may read data stored in a first super memory block of a plurality of super memory blocks (S610).

In addition, the second processor PROCESSOR_2 may determine whether an error has occurred during the operation of reading data stored in the first super memory block in step S610 (S620). For example, the second processor PROCESSOR_2 may determine that the error has occurred when the number of error bits generated when reading data is greater than or equal to a predetermined (threshold) number of error bits.

If the error is determined to occur during the operation of reading data stored in the first super memory block (S620—Y), the second processor PROCESSOR_2 may execute the recovery operation for the determined error (S630). In addition, the second processor PROCESSOR_2 may update the second read count table entry corresponding to the first super memory block in the partial read count table PRCT (S640), and the operation of the second processor may be ended (End). It the second processor determines that no error occurs during the operation of reading data (S620—N), no action is performed by the second processor (End).

That is, the second processor PROCESSOR_2 may reflect the count of the read operation during the recovery operation for the error occurring during the read operation to the partial read count table PRCT, and then may transmit the update message in order for the first processor PROCESSOR_1 to update the main read count table MRCT based on the partial read count table PRCT. Therefore, the first processor PROCESSOR_1 may realize the count of the read operations which occur during the recovery operation for the error occurred during the read operation, and may determine whether to execute the read reclaim operation.

Hereinafter, it will be described an exemplary operation of updating the second read count table entry included in the partial read count table PRCT by the second processor PROCESSOR_2 in step S640.

FIG. 7 is a diagram illustrating an exemplary embodiment in which the second processor PROCESSOR_2 updates the partial read count table PRCT according to embodiments of the present disclosure.

In FIG. 7, if any one of the plurality of sub-read counts CNT_SUB P0, P1, P2, P3, P4, P5, P6, P7, and P8 included in the read count table entry included in the partial read count table PRCT is equal to or greater than a specific threshold sub-read count, the second processor PROCESSOR_2 may increase the main read count CNT_MAIN of the corresponding read count table entry by a first value (e.g., 1) and may decrease all of the plurality of sub-read counts by a second value (e.g., 1). In some embodiments, the first value and the second value may be the same. In other embodiments, the first value and the second value may be different from each other.

In FIG. 7, it is assumed that the partial read count table PRCT includes read count table entries for three super memory blocks SB1, SB3, and SBN, respectively.

In this embodiment, when the second processor PROCESSOR_2 performs the recovery operation for the error occurring during the read operation of data included in the super memory block SB3, it will be described the case in which the read operation is performed twice for the sub-area P4 of the super memory block SB3 (S710).

In this embodiment, the second processor PROCESSOR_2 may increase the sub-read count corresponding to the sub-area P4 from 3 to 5, among the eight sub-read counts CNT_SUB P0, P1, P2, P3, P4, P5, P6, P7, and P8 included in the read count table entry corresponding to the super memory block SB3 in the partial read count table PRCT (S720). Therefore, the second processor PROCESSOR_2 may increase the sub-read count CNT_SUB for the sub-area in which the read operation is performed during the recovery operation by the number of times the read operation is performed.

In FIG. 7, it is assumed that the threshold sub-read count serving as the reference for updating the main read count CNT_MAIN and the sub-read count CNT_SUB of the read count table entry is 5.

In this embodiment, one of the sub-read counts included in the read count table entry corresponding to the super memory block SB3 in the partial read count table PRCT may be greater than the threshold sub-read count of 5.

In this embodiment, the second processor PROCESSOR_2 may increase the main read count CNT_MAIN of the read count table entry corresponding to the super memory block SB3 from 80 to 81 by the first value of 1. In addition, the second processor PROCESSOR_2 may decrease all of the eight sub-read counts CNT_SUB of the read count table entry corresponding to the super memory block SB3 by the second value of 1.

Accordingly, the above exemplary embodiment has described the operation of updating the read count table entry included in the partial read count table PRCT by the second processor PROCESSOR_2.

Hereinafter, it will be described an exemplary operation of determining whether to transmit an update message to the first processor PROCESSOR_1 based on the partial read count table PRCT by the second processor PROCESSOR_2.

Figure 8:
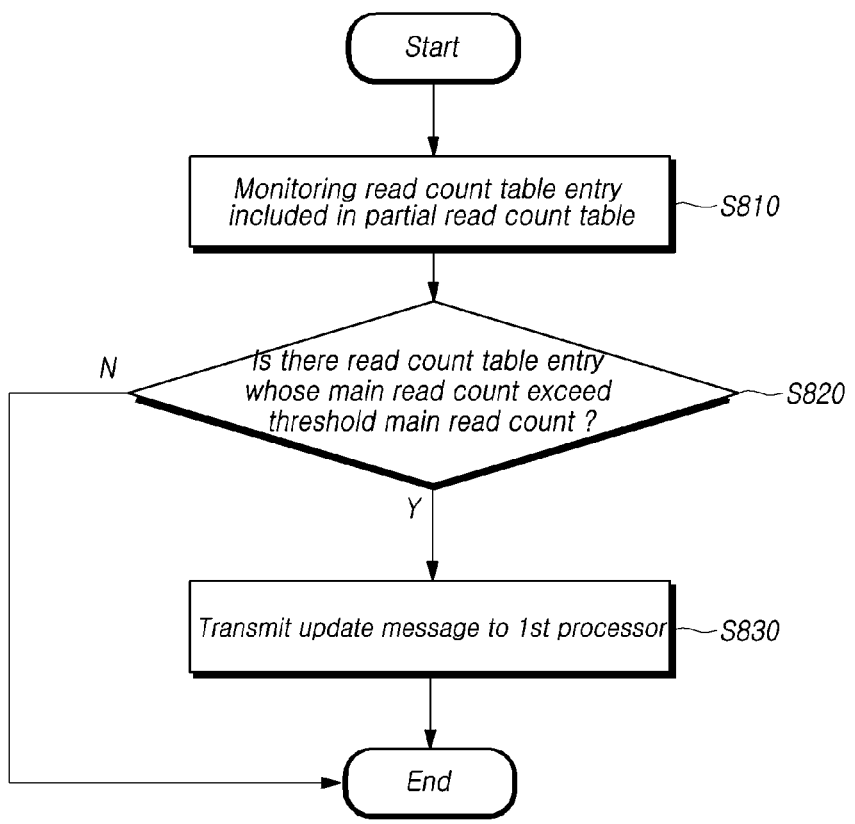
FIG. 8 is a flowchart illustrating an exemplary operation of determining whether to transmit an update message to a first processor by a second processor according to embodiments of the present disclosure.

FIG. 8 is a flowchart illustrating an exemplary operation of determining whether to transmit an update message to the first processor PROCESSOR_1 by the second processor PROCESSOR_2 according to embodiments of the present disclosure.

Referring to FIG. 8, the second processor PROCESSOR_2 may monitor the second read count table entry included in the partial read count table PRCT (S810).

In addition, the second processor PROCESSOR_2 may determine whether the second read count table entry in which the main read count CNT_MAIN of the partial read count table PRCT is greater than or equal to the threshold main read count exists among the second read count table entries included in the partial read count table PRCT (S820).

Figure 9:
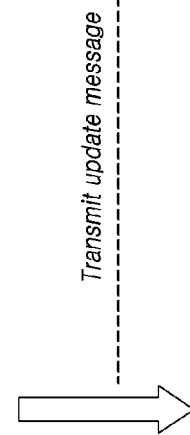
FIG. 9 is a diagram illustrating changes in a main read count table and a partial read count table when the operation described in FIG. 8 is executed.

When the second processor PROCESSOR_2 determines the presence of a second read count table entry of the partial read count table PRCT in which the main read count CNT_MAIN is equal to or greater than the threshold main read count (S820—Y), the second processor PROCESSOR_2 may transmit the update message to the first processor PROCESSOR_1 (S830), and the operation of the second processor may be ended (End). When the second processor PROCESSOR_2 determines that the second read count table entry in which the main read count CNT_MAIN is not equal to or greater than the threshold main read count (S820—N), no operation is performed by the second processor PROCESSOR_2. FIG. 9 is a diagram illustrating changes in the main read count table MRCT and the partial read count table PRCT when the operations described in FIG. 8 are executed.

In FIG. 9, the partial read count table PRCT may include three second read count table entries for three super memory blocks SB1, SB3, and SBN, respectively (S910).

In FIG. 9, it is assumed that an error occurs during the read operation to the three super memory blocks SB1, SB3, and SBN, and the main read count of the second read count table entry for the super memory block SB1 is updated to 55, the main read count of the read count table entry for the super memory block SB3 is updated to 90, and the main read count of the read count table entry for the super memory block SBN is updated to 45 (S920). In addition, it is assumed that the threshold main read count is 90.

In this case, since the main read count of the second read count table entry for the super memory block SB3 is equal to or greater than 90 which is the threshold main read count, the second processor PROCESSOR_2 may transmit the update message to the first processor PROCESSOR_1. In addition, after receiving the update message, the first processor PROCESSOR_1 may update the main read count table MRCT based on the partial read count table PRCT (S930).

Specifically, since the main read count of the second read count table entry for the super memory block SB1 in the partial read count table PRCT has been updated from 50 to 55, the main read count of the first read count table entry for the super memory block SB1 in the main read count table MRCT may be updated from 50 to 55. Similarly, in the main read count table MRCT, the main read count of the first read count table entry for the super memory block SB3 may be updated from 80 to 90, and the main read count of the first read count table entry for the super memory block SBN may be updated from 40 to 45.

Figure 10:
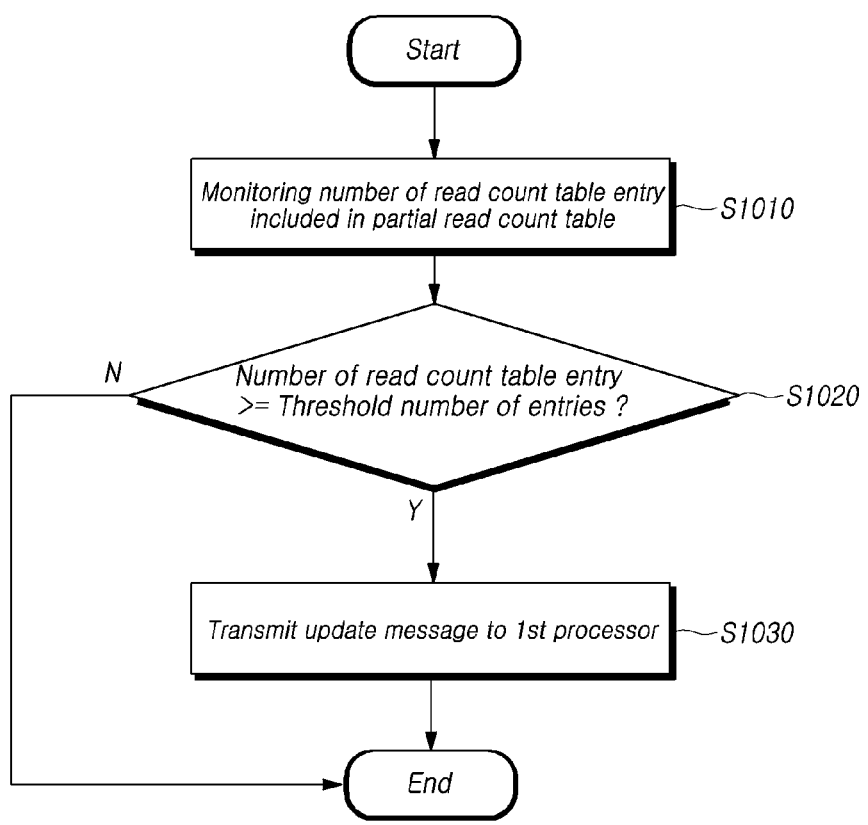
FIG. 10 is a flowchart illustrating another exemplary operation of determining whether to transmit an update message to a first processor by a second processor according to embodiments of the present disclosure.

FIG. 10 is a flowchart illustrating another example of an operation of determining whether to transmit the update message to the first processor PROCESSOR_1 by the second processor PROCESSOR_2 according to embodiments of the present disclosure.

Referring to FIG. 10, the second processor PROCESSOR_2 may monitor the number of second read count table entries included in the partial read count table PRCT (S1010). The number of second read count table entries included in the partial read count table PRCT may refer to the number of super memory blocks in which the error occurs during the read operation.

In addition, the second processor PROCESSOR_2 may determine whether the number of second read count table entries included in the partial read count table PRCT is equal to or greater than the predetermined threshold number of entries (S1020).

If the number of read count table entries included in the partial read count table PRCT is greater than or equal to the threshold number of entries (S1020—Y), the second processor PROCESSOR_2 may transmit the update message to the first processor PROCESSOR_1 (S1030) and the operation of the second processor may be terminated (End). If the number of read count table entries included in the partial read count table PRCT is not greater than or equal to the threshold number of entries (S1020—N), the second processor does nothing (End).

Figure 11:
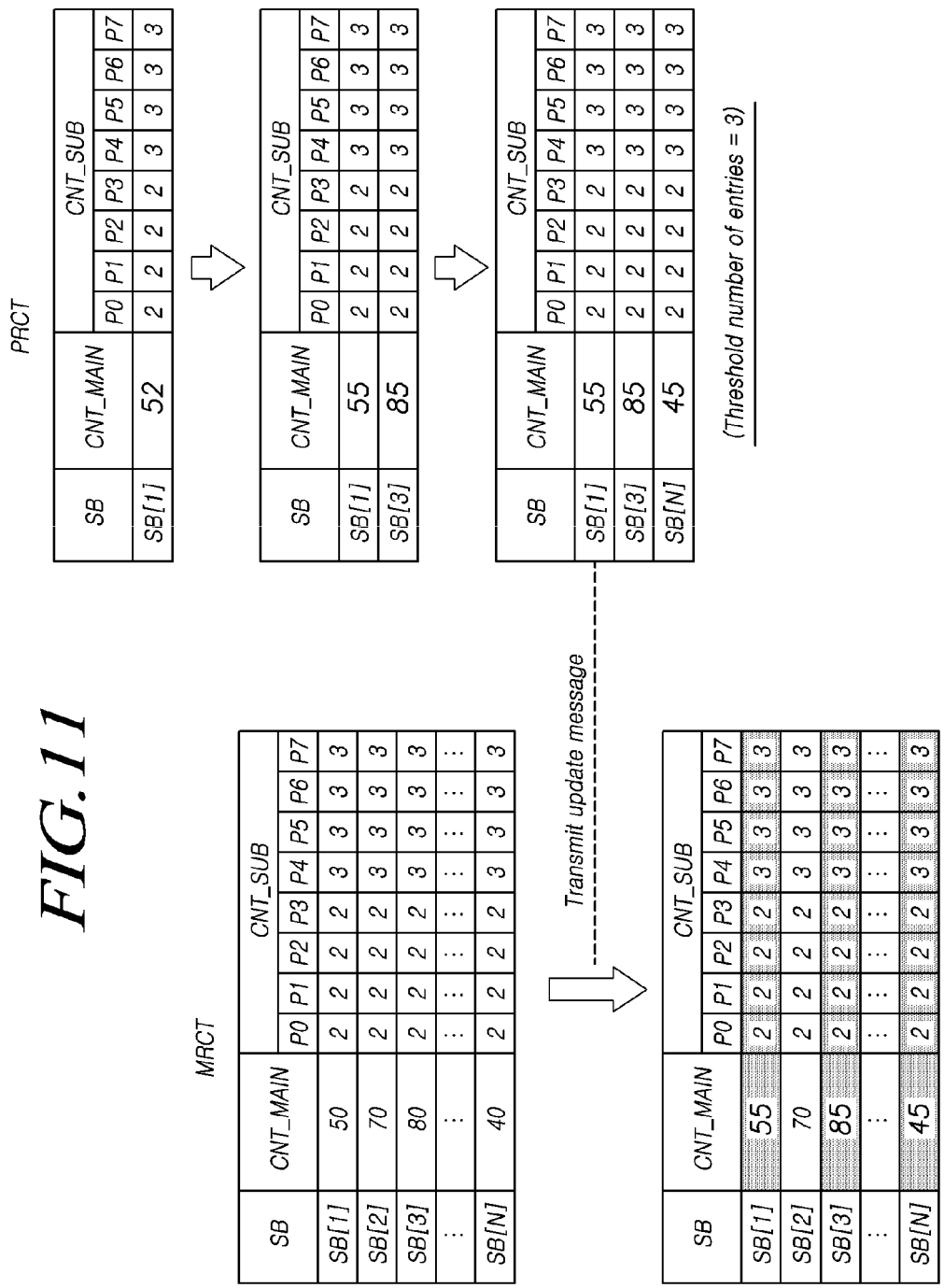
FIG. 11 is a diagram illustrating changes in a main read count table and a partial read count table when the operation described in FIG. 10 is executed.

FIG. 11 is a diagram illustrating changes in the main read count table MRCT and the partial read count table PRCT when the operation described in FIG. 10 is executed.

In FIG. 11, it is assumed that the threshold number of entries is 3.

In FIG. 11, it is assumed that the error occurs during the read operation for the super memory block SB1, and the recovery operation for the error is performed (S1110). In this case, the second read count table entry for the super memory block SB1 may be newly added to the partial read count table PRCT, and the number of second read count table entries included in the partial read count table PRCT is one.

Next, it is assumed that an error occurs during the read operation for the super memory block SB3, and the recovery operation for the error is performed. In this case, a second read count table entry for the super memory block SB3 is newly added to the partial read count table PRCT, and the number of read count table entries included in the partial read count table PRCT is two (S1120).

Next, it is assumed that the error occurs during the read operation for the super memory block SBN, and the recovery operation for the error has been performed. At this time, a second read count table entry for the super memory block SBN is newly added to the partial read count table PRCT, and the number of read count table entries included in the partial read count table PRCT is three (S1130).

In this case, since the number of read count table entries included in the partial read count table PRCT becomes greater than or equal to the threshold number of entries, the second processor PROCESSOR_2 may transmit the update message to the first processor PROCESSOR_1. In addition, after receiving the update message from the second processor PROCESSOR_2, the first processor PROCESSOR_1 may update the main read count table MRCT based on the partial read count table PRCT.

In one embodiment, since the main read count of the read count table entry for the super memory block SB1 in the partial read count table PRCT has been updated from 50 to 55, the main read count of the first read count table entry for the super memory block SB1 in the main read count table MRCT may be updated from 50 to 55. Similarly, in the main read count table MRCT, the main read count of the first read count table entry for the super memory block SB3 may be updated from 80 to 85, and the main read count of the first read count table entry for the super memory block SBN may be updated from 40 to 45 (S1140).

Accordingly, the above exemplary embodiment has described the condition under which the operation of updating the main read count table MRCT is executed based on the partial read count table PRCT.

Hereinafter, it will be described an exemplary method of updating the main read count table MRCT by the memory system 100 when this condition is satisfied.

Figure 12:
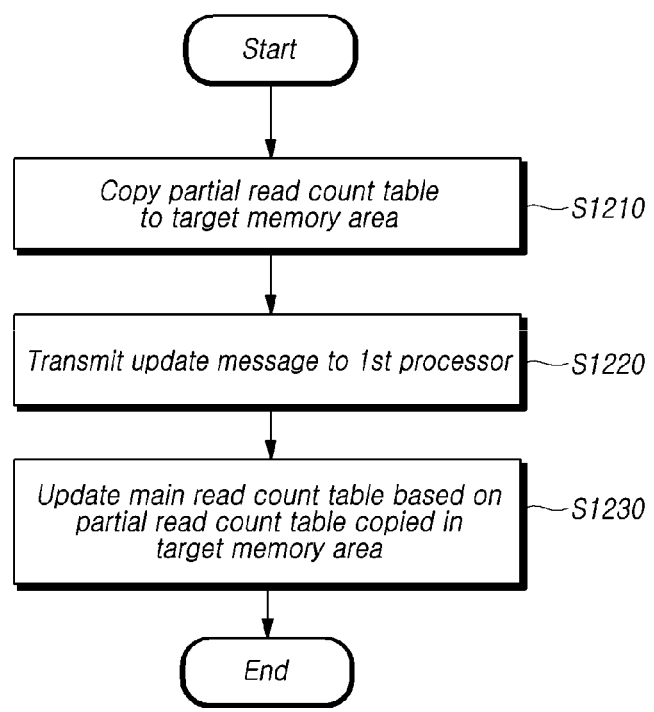
FIG. 12 is a flowchart illustrating an example of an operation of updating a main read count table by a memory system according to embodiments of the present disclosure.

FIG. 12 is a flowchart illustrating an exemplary operation of updating the main read count table MRCT by the memory system 100 according to embodiments of the present disclosure.

Referring to FIG. 12, the second processor PROCESSOR_2 of the memory system 100 may copy the partial read count table PRCT to a predetermined target memory area in order to update the main read count table MRCT (S1210).

The second processor PROCESSOR_2 may transmit an update message to the first processor PROCESSOR_1 after copying the partial read count table PRCT to the preset target memory area (S1220). That is, the second processor PROCESSOR_2 may copy the partial read count table PRCT to the predetermined target memory area before transmitting the update message to the first processor PROCESSOR_1.

After transmitting the update message to the first processor PROCESSOR_1, the second processor PROCESSOR_2 may perform other operations without being involved in updating the main read count table MRCT or waiting for whether the main read count table MRCT is updated. Accordingly, performance degradation occurring in the process of updating the main read count table MRCT can be minimized or eliminated.

In addition, when receiving the update message from the second processor PROCESSOR_2, the first processor PROCESSOR_1 of the memory system 100 may update the main read count table MRCT based on the partial read count table PRCE copied to the target memory area (S1230).

Figure 13:
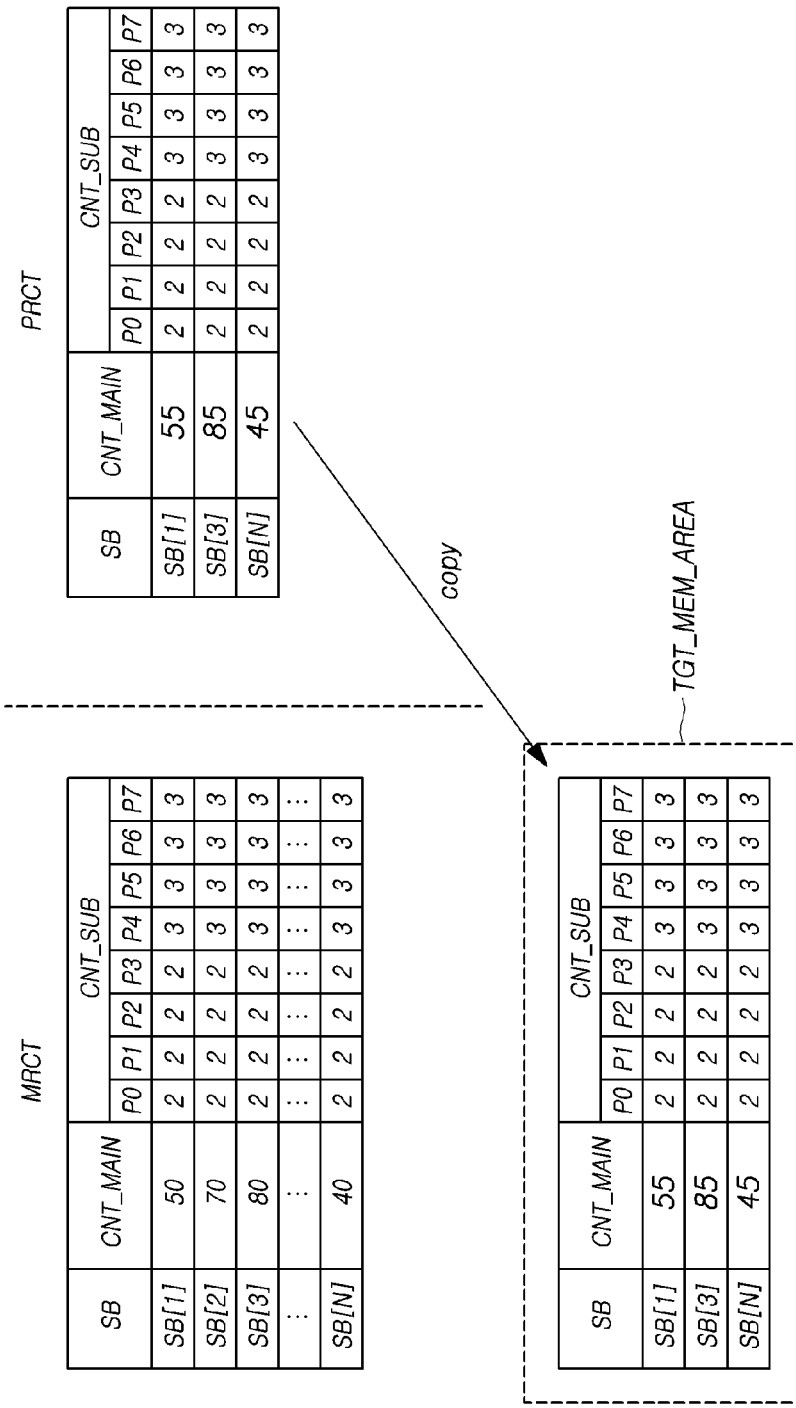
FIG. 13 is a diagram illustrating an operation of copying a partial read count table to a target memory area by a second processor according to embodiments of the present disclosure.

FIG. 13 is a diagram illustrating an operation of copying the partial read count table PRCE to a target memory area TGT_MEM_AREA by the second processor PROCESSOR_2 according to embodiments of the present disclosure.

In FIG. 13, it will be described the case in which the main read count table MRCT is updated based on the partial read count table PRCT including partial read count table entries for the three super memory blocks SB1, SB3, and SBN.

The second processor PROCESSOR_2 may copy the partial read count table PRCT to the target memory area TGT_MEM_AREA before transmitting the update message to the first processor PROCESSOR_1.

In this case, the target memory area TGT_MEM_AREA can be accessed by both the first processor PROCESSOR_1 and the second processor PROCESSOR_2. For example, the target memory area TGT_MEM_AREA may be located in a shared memory to which different processors can access simultaneously or concurrently on the working memory 125.

Figure 14:
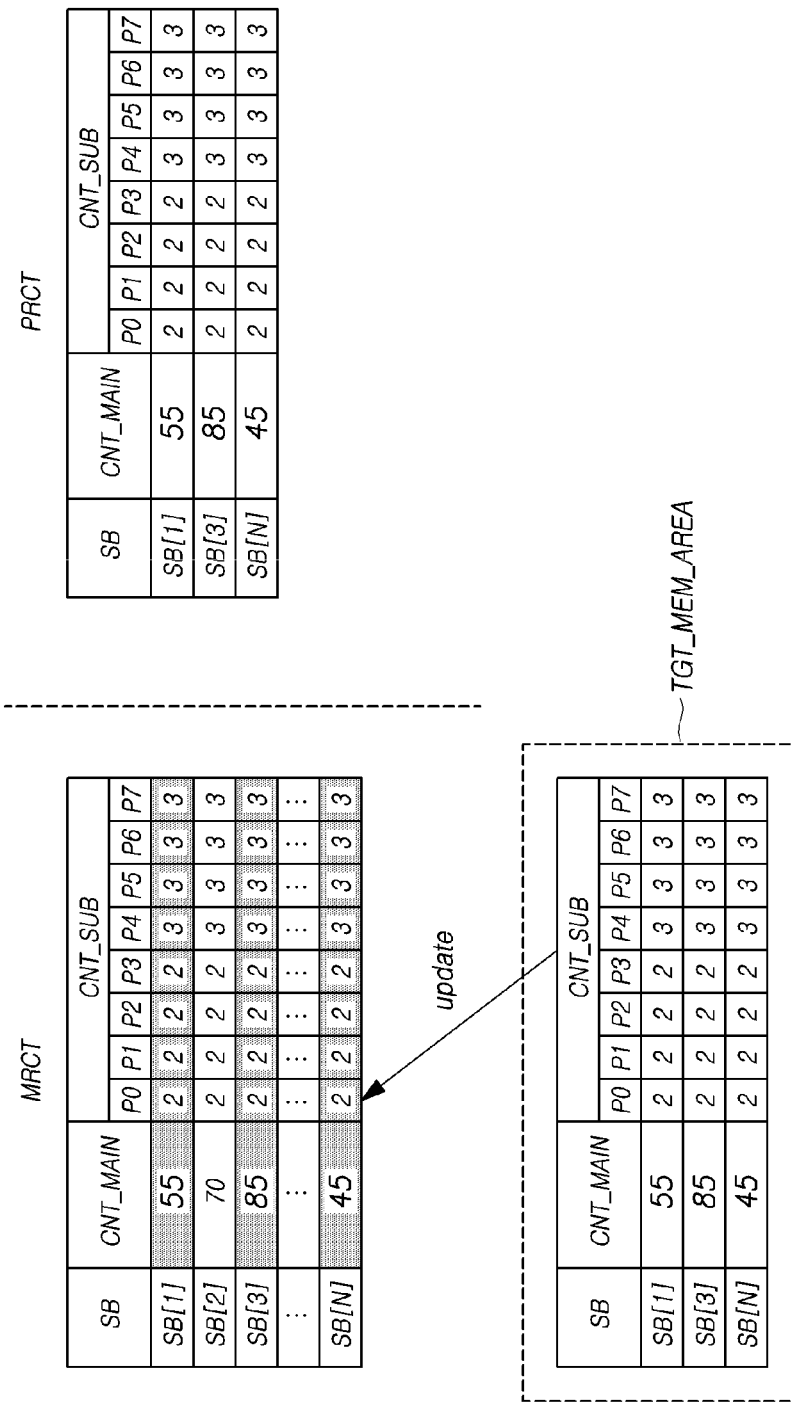
FIG. 14 is a diagram illustrating an operation of updating a main read count table based on a partial read count table copied to a target memory area by a first processor according to embodiments of the present disclosure.

FIG. 14 is a diagram illustrating an operation of updating the main read count table MRCT based on the partial read count table PRCT copied to the target memory area TGT_MEM_AREA by the first processor PROCESSOR_1 according to embodiments of the present disclosure.

Referring to FIG. 14, after receiving the update message from the second processor PROCESSOR_2, the first processor PROCESSOR_1 may access the partial read count table PRCT copied to the target memory area TGT_MEM_AREA, and may update the main read count table MRCT based on the partial read count table PRCT.

In one embodiment, the first processor PROCESSOR_1 may update the main read count of a first read count table entry corresponding to the super memory block SB1 to 55 in the main read count table MRCT. Further, the first processor PROCESSOR_1 may update the main read count of a first read count table entry corresponding to the super memory block SB3 to 85, and may update the main read count of a first read count table entry corresponding to the super memory block SBN to 45 in the main read count table MRCT.

Hereinafter, an example of the time point at which the second processor PROCESSOR_2 transmits the update message to the first processor PROCESSOR_1 will be described in more detail.

Figure 15:
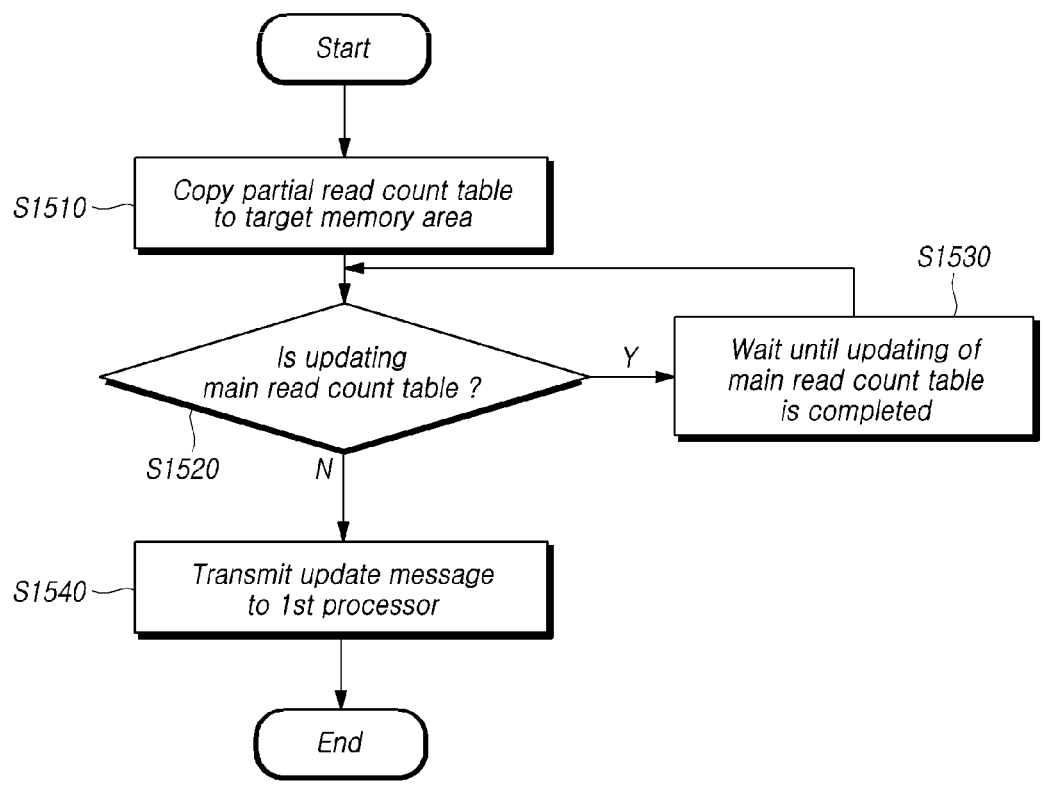
FIG. 15 is a flowchart illustrating an exemplary operation of determining a time point at which a second processor transmits an update message to a first processor according to embodiments of the present disclosure.

FIG. 15 is a flowchart illustrating an exemplary operation of determining a time point at which the second processor PROCESSOR_2 transmits an update message to the first processor PROCESSOR_1 according to embodiments of the present disclosure.

Referring to FIG. 15, the second processor PROCESSOR_2 may copy the partial read count table PRCT into the target memory area TGT_MEM_AREA for the first processor PROCESSOR_1 to update the main read count table MRCT (S1510).

Then, the second processor PROCESSOR_2 may determine whether the first processor PROCESSOR_1 is currently updating the main read count table MRCT, instead of transmitting the update message to the first processor PROCESSOR_1 immediately after step S1510 is completed (S1520).

If the first processor PROCESSOR_1 is updating the main read count table MRCT (S1520—Y), the second processor PROCESSOR_2 may wait until the operation of the first processor PROCESSOR_1 to update the main read count table MRCT is completed (S1530). Thereafter, the second processor PROCESSOR_2 may again determine whether the first processor PROCESSOR_1 is currently updating the main read count table MRCT (S1520).

Meanwhile, if the first processor PROCESSOR_1 is not updating the main read count table MRCT (S1520—N), the second processor PROCESSOR_2 may transmit the update message to the first processor PROCESSOR_1 (S1540), and the operation may be terminated (End).

The advantages and benefits for the second processor PROCESSOR_2 to wait until the operation of updating the main read count table MRCT is completed are: While the first processor PROCESSOR_1 is updating the main read count table MRCT based on the previously generated partial read count table, if changes in the new partial read count table are reflected in the main read count table MRCT, there may be a possibility that changes in the previously generated partial read count table may not be properly reflected in the main read count table MRCT.

Though the probability of occurrence is low, such a problem may occur when the first processor PROCESSOR_1 operates very slow compared to the second processor PROCESSOR_2. Accordingly, until the operation of updating the main read count table MRCT by the second processor PROCESSOR_2 is completed, it is possible to wait without transmitting the update message to the first processor PROCESSOR_1.

Figure 16:
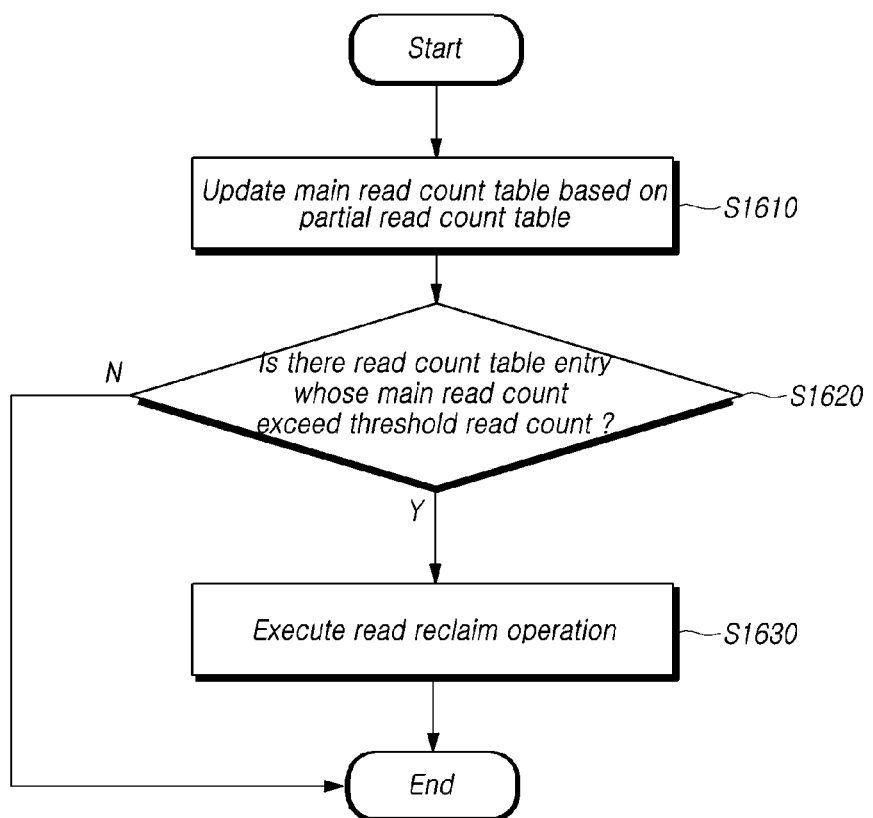
FIG. 16 is a flowchart illustrating an exemplary operation of determining whether to execute a read reclaim operation by a first processor according to embodiments of the present disclosure.

FIG. 16 is a flowchart illustrating an exemplary operation of determining whether to execute a read reclaim operation by the first processor PROCESSOR_1 according to embodiments of the present disclosure.

Referring to FIG. 16, the first processor PROCESSOR_1 may update the main read count table MRCT based on the partial read count table PRCT (S1610).

In addition, the first processor PROCESSOR_1 may determine whether there is a read count table entry whose main read count is equal to or greater than the threshold read count among the read count table entries included in the main read count table MRCT (S1620).

If the first processor determines that a read count table entry whose main read count is greater than or equal to the threshold read count exists among the read count table entries included in the main read count table MRCT (S1620—Y), the first processor PROCESSOR_1 may execute the read reclaim operation for the super memory block corresponding to the corresponding read count table entry (S1630), and the operation may be terminated (End). If the first processor determines that a read count table entry whose main read count is not greater than or equal to the threshold read count exists among the read count table entries included in the main read count table MRCT (S1620—N), the first processor does nothing (End).

Figure 17:
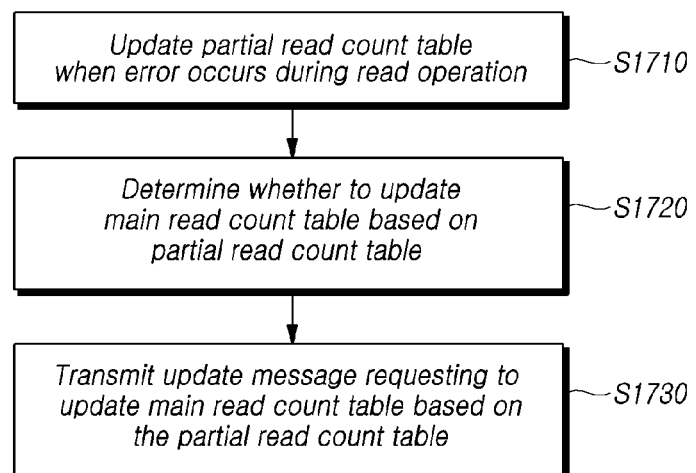
FIG. 17 is a flowchart illustrating an operating method of a memory system according to embodiments of the present disclosure.

FIG. 17 is a diagram illustrating an operating method of the memory system 100 according to embodiments of the present disclosure.

Referring to FIG. 17, the operating method of the memory system 100 may include, when the error occurs during the operation of reading data stored in any one of the plurality of super memory blocks, the step of updating the read count table PRCT by a second processor PROCESSOR_2 included in the memory system 100 (S1710). In this case, the partial read count table PRCT may store the read count table entry including information on the count of the read operation executed during the above-described recovery operation for the error.

In addition, the operating method of the memory system 100 may include the step of determining whether to update the main read count table MRCT based on the partial read count table PRCT updated in step S1710 by the second processor PROCESSOR_2 (S1720). In this case, the main read count table MRCT may include the read count table entry for each of the plurality of super memory blocks, and the read count table entry may include information on the count of the read operation executed for the corresponding super memory block.

The operating method of the memory system 100 may include, when updating the main read count table MRCT based on the partial read count table PRCT, the step of transmitting the update message requesting to update the main read count table MRCT based on the partial read count table PRCT to the first processor PROCESSOR_1 by the second processor PROCESSOR_2 (S1730).

In one embodiment, the read count table entry may include, for the first super memory block corresponding to the corresponding read count table entry among the plurality of super memory blocks, the main read count corresponding to the entire first super memory block and the plurality of sub-read counts corresponding to each of the plurality of sub-areas included in the first super memory block.

In step S1710, for example, the second processor PROCESSOR_2 may increase the main read count by the first value and decrease all of the plurality of sub-read counts by the second value when any one of the plurality of sub-read counts is equal to or greater than the preset threshold sub-read count, and all of the read counts may be decreased by the second value.

In step S1730, as an example, the second processor PROCESSOR_2 may send the update message to the first processor PROCESSOR_1 if is the second processor determines the presence of the read count table entry whose main read count is equal to or greater than the specific threshold main read count among the read count table entries included in the partial read count table PRCT.

In step S1730, as another example, the second processor PROCESSOR_2 may transmit the update message to the first processor PROCESSOR_1 if the number of second read count table entries included in the partial read count table is equal to or greater than the preset threshold number of entries.

In one embodiment, in step S1730, the second processor PROCESSOR_2 may copy the partial read count table to the specific target memory area before transmitting the update message to the first processor PROCESSOR_1. In this case, the target memory area may be accessible by both the first processor PROCESSOR_1 and the second processor PROCESSOR_2. In addition, after receiving the update message, the first processor PROCESSOR_1 may update the main read count table MRCT based on the partial read count table PRCT stored in the target memory area.

In step S1730, if the first processor PROCESSOR_1 is updating the main read count table, the second processor PROCESSOR_2 may transmit the update message to the first processor after the first processor PROCESSOR_1 completes the operation of updating the main read count table MRCT.

The first processor PROCESSOR_1 may, after updating the main read count table MRCT, execute the read reclaim operation for the first super memory block when the main read count of the read count table entry corresponding to the first super memory block among the plurality of super memory blocks is greater than or equal to the threshold read count.

In some implementations, the operation of the memory controller 120 described above may include the controller circuit 123 of FIG. 1, may be controlled by the control circuit 123, and may be performed in such a manner that the processor 124 (including the first processor PROCESSOR_1 and the second processor PROCESSOR_2) executes (drives) firmware in which the overall operation of the memory controller 120 is programmed.

Figure 18:
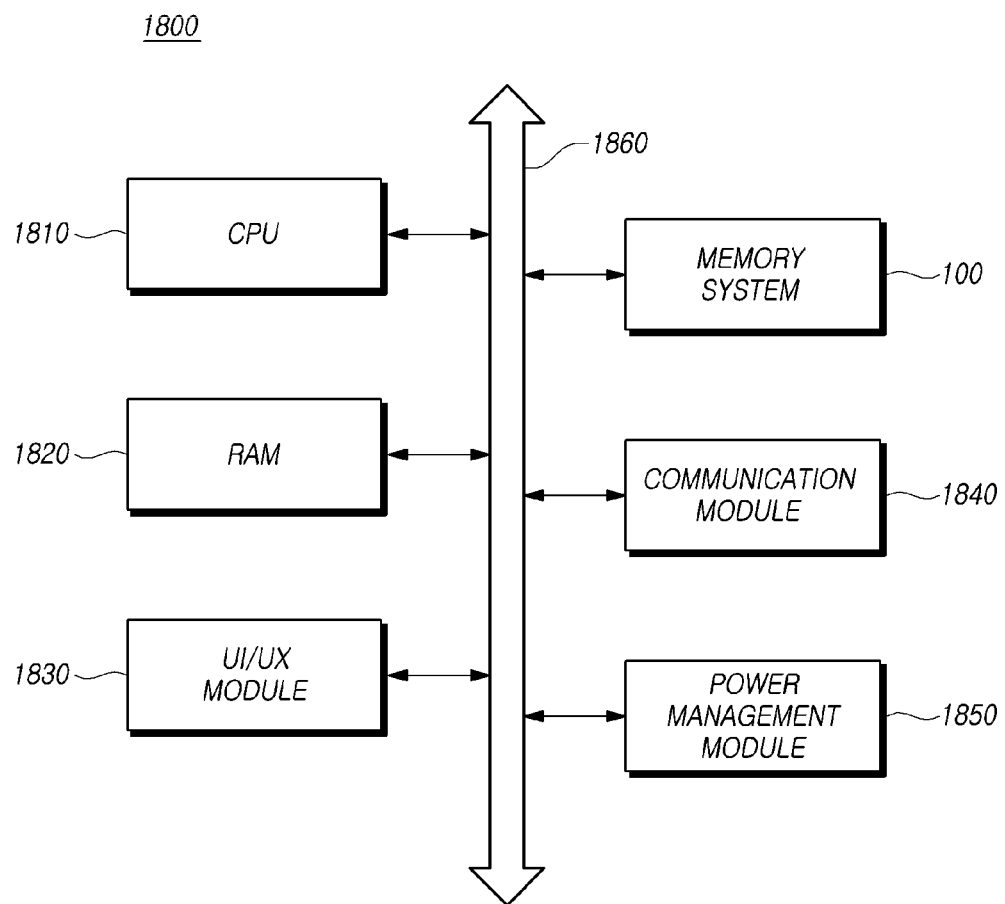
FIG. 18 is a diagram illustrating the configuration of a computing system based on embodiments of the disclosed technology.

FIG. 18 is a diagram illustrating the configuration of a computing system 1800 based on an embodiment of the disclosed technology.

Referring to FIG. 18, the computing system 1800 based on an embodiment of the disclosed technology may include: a memory system 100 or 100 electrically connected to a system bus 1860; a CPU 1810 configured to control the overall operation of the computing system 1800; a RAM 1820 configured to store data and information related to operations of the computing system 1800; a user interface/ user experience (UI/UX) module 1830 configured to provide the user with a user environment; a communication module 1840 configured to communicate with an external device as a wired and/or wireless type; and a power management module 1850 configured to manage power used by the computing system 1800.

The computing system 1800 may be a personal computer (PC) or may include a mobile terminal such as a smartphone, a tablet or various electronic devices.

The computing system 1800 may further include a battery for supplying an operating voltage, and may further include an application chipset, a graphic-related module, a camera image processor, and a DRAM. Other elements would be obvious to a person skilled in the art.

The memory system 100 or 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The nonvolatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

Based on embodiments of the disclosed technology described above, the operation delay time of the memory system may be reduced or minimized. In addition, the disclosed technology can be implemented in a way that reduces or minimizes an overhead occurring in the process of calling a specific function. Although various embodiments of the disclosed technology have been described for illustrative purposes, those skilled in the art will appreciate that various modifications, additions and substitutions are possible based on what is described and illustrated in the present disclosure.

What is claimed is:

1. A memory system comprising: a memory device including a plurality of super memory blocks; and a memory controller for communicating with the memory device and controlling the memory device, the memory controller comprising a first processor and a second processor, wherein the first processor is configured to manage a main read count table including a plurality of first read count table entries, each one of the plurality of first read count table entries corresponding to one of the plurality of super memory blocks, a first read count table entry comprising information on a count of a first read operation executed on a corresponding super memory block, and the second processor is configured to manage a partial read count table including a plurality of second read count table entries, a second read count table entry including information on a count of a second read operation executed during a recovery operation for an error, when the error occurs during an operation of reading data stored in one of the plurality of super memory blocks, and transmits an update message to the first processor when updating the main read count table based on the partial read count table.

2. The memory system of claim 1, wherein a second read count table entry comprises, for a first super memory block corresponding to a read count table entry among the plurality of super memory blocks, a main read count corresponding to the first super memory block and a plurality of sub-read counts corresponding to each of a plurality of sub-areas included in the first super memory block.

3. The memory system of claim 2, wherein the second processor is configured to, when any one of the plurality of sub-read counts exceeds a threshold sub-read count, increase the main read count by a first value and decrease all of the plurality of sub-read counts by a second value.

4. The memory system of claim 2, wherein the second processor transmits the update message to the first processor when the second read count table entry having the main read count is equal to or greater than a threshold main read count among the second read count table entries included in the partial read count table.

5. The memory system of claim 2, wherein the second processor is configured to transmit, when a number of the second read count table entries included in the partial read count table is greater than or equal to a threshold number of entries, the update message to the first processor.

6. The memory system of claim 1, wherein the second processor is configured to copy the partial read count table to a target memory area before transmitting the update message to the first processor, and the first processor is configured to, after receiving the update message, update the main read count table based on the partial read count table stored in the target memory area.

7. The memory system of claim 6, wherein the target memory area is accessible by both the first processor and the second processor.

8. The memory system of claim 6, wherein, when the first processor updates the main read count table, the second processor transmits the update message to the first processor after updating the main read count table by the first processor has been completed.

9. The memory system of claim 1, wherein the first processor is configured to execute, after updating the main read count table based on the partial read count table, a read reclaim operation for a first super memory block when a main read count of a read count table entry corresponding to a first super memory block among the plurality of super memory blocks is greater than or equal to a threshold read count.

10. An operating method of a memory system including a plurality of super memory blocks, a first processor, and a second processor comprising: updating, when an error occurs while reading data stored in one of the plurality of super memory blocks, by the second processor, a partial read count table storing a plurality of second read count table entries, each second read count table entry comprising information on a count of a read operation executed during a recovery operation for the error; determining, by the second processor, whether to update a main read count table based on the updated partial read count table, the main read count table including a plurality of first read count table entries, each one of the plurality of first read count table entries corresponding to one of the plurality of super memory blocks based on the partial read count table, a first read count table entry comprising information on a count of the read operation executed on a corresponding super memory block; and transmitting, when the main read count table is determined to be updated, by the second processor, an update message to the first processor.

11. The method of claim 10, wherein a second read count table entry comprises, for a first super memory block corresponding to the read count table entry among the plurality of super memory blocks, a main read count corresponding to the first super memory block and a plurality of sub-read counts corresponding to each of a plurality of sub-areas included in the first super memory block.

12. The method of claim 11, wherein updating the partial read count table comprises, when any one of the plurality of sub-read counts exceeds a threshold sub-read count, increasing the main read count by a first value and decreasing all of the plurality of sub-read counts by a second value.

13. The method of claim 11, wherein transmitting the update message to the first processor comprises transmitting the update message to the first processor when the second read count table entry having the main read count is equal to or greater than a threshold main read count among the read count table entries included in the partial read count table.

14. The method of claim 11, wherein transmitting the update message to the first processor comprises transmitting the update message to the first processor when a number of the second read count table entries included in the partial read count table is greater than or equal to a threshold number of entries.

15. The method of claim 10, wherein transmitting the update message to the first processor comprises:

copying the partial read count table to a target memory area before transmitting the update message to the first processor, and updating, after receiving the update message, by the first processor, the main read count table based on the partial read count table stored in the target memory area.

16. The method of claim 15, wherein the target memory area is capable of being accessed by both the first processor and the second processor.

17. The method of claim 15, wherein transmitting the update message to the first processor comprises transmitting, when the first processor updates the main read count table, the update message to the first processor after the operation of updating the main read count table by the first processor has been completed.

18. The method of claim 10, further comprising executing, after updating the main read count table based on the partial read count table, by the first processor, a read reclaim operation for a first super memory block when a main read count of a read count table entry corresponding to a first super memory block among the plurality of super memory blocks is greater than or equal to a threshold read count.

19. The method of claim 10, further comprising:
determining, by the second processor, whether a main read count of a read count table entry corresponding to a first super memory block among the plurality of super memory blocks is greater than or equal to a threshold read count; and transmitting, by the second processor, the update message to the first processor, when the main read count is greater than or equal to the threshold read count.

20. The method of claim 10, further comprising:
determining, by the second processor, that a number of second read count table entries in the partial read count table is greater than or equal to a threshold number of entries; and transmitting, by the second processor, the update message to the first processor, when the number of second count table entries is greater than or equal to the threshold number of entries.

* * * * *